United States Patent [19]
Chakrabarti et al.

[11] Patent Number: 6,033,926
[45] Date of Patent: Mar. 7, 2000

[54] METHOD FOR MAKING MULTIPLE WAVELENGTH SEMICONDUCTOR LASERS ON A SINGLE WAFER

[75] Inventors: Utpal Kumar Chakrabarti, Allentown; Richard W. Glew, Breinigsville; Karen A. Grim-Bogdan, Kutztown, all of Pa.

[73] Assignee: Lucent Technologies Inc., Murry Hill, N.J.

[21] Appl. No.: 09/090,366

[22] Filed: Jun. 4, 1998

[51] Int. Cl.[7] .................................................. H01L 21/20
[52] U.S. Cl. ............................ 438/32; 438/35; 438/936; 438/956
[58] Field of Search .................................. 438/22, 23, 32, 438/34, 35, 493, 494, 497, 498, 503, 504, 936, 956

[56] References Cited

U.S. PATENT DOCUMENTS 4,148,045  4/1979  Fang et al. .
4,309,667  1/1982  DiForte et al. .

*Primary Examiner*—Charles Bowers
*Assistant Examiner*—Keith Christianson

[57] ABSTRACT

A plurality of different wavelength semiconductor lasers are fabricated on a single semiconductor substrate by establishing a thermal gradient across the substrate during epitaxial growth. The result is a variation in composition which produces a corresponding variation of laser wavelength across the substrate. The thermal gradient is preferably achieved by disposing a patterned layer of material (heat reflecting or heat absorbing) on the back side of the substrate, radiatively heating the backside and growing the active layers on the front side. The backside layer is removed when the substrate is lapped to final thickness.

7 Claims, 2 Drawing Sheets

METHOD FOR MAKING MULTIPLE WAVELENGTH SEMICONDUCTOR LASERS ON A SINGLE WAFER

FIELD OF THE INVENTION

This invention relates to methods for making semiconductor lasers and, in particular, to a method for making a plurality of different wavelength semiconductor lasers on a single substrate such as a semiconductor wafer.

BACKGROUND OF THE INVENTION

Semiconductor lasers are important components of optical communication systems. They serve, for example, as sources of light to be digitally modulated and transmitted along an optical fiber network. In wavelength division multiplexed optical systems several different closely-spaced wavelength signals are transmitted at the same time. Semiconductor lasers provide the different wavelengths of light for carrying these signals.

Semiconductor distributed feedback lasers (DFB lasers) are particularly useful in optical communications because they have very narrow linewidths which permit the transmission of numerous different wavelength channels without substantial overlap. A DFB laser typically includes a periodic grating sufficiently close to its active region to interact with the lasing optical field. An active region comprising a plurality of quantum wells is typically grown over the grating. The grating narrows the lasing linewidth so that many different wavelength channels can be transmitted for optical fiber communication As a consequence, there is a demand for DFB semiconductor lasers in a variety of different, closely-spaced wavelengths.

One problem in providing needed lasers is the difficulty of fabricating the lasers in different wavelengths. The current practice is to make a batch of many single wavelength lasers on a single wafer. Gratings of predetermined pitch targeted for a particular wavelength are holographically formed over the entire wafer. But to supply lasers with different wavelengths—which may be separated by as much as 40 nanometers—one must fabricate many wafers and a very large number of lasers. Moreover the demands for lasers for different wavelengths are not equal. Therefore by the current practice, one is left with a large inventory of lasers (wavelengths not in demand) and of wafers which, due to slight inaccuracies, cannot meet very demanding requirements of correct wavelength.

Efforts have been made to circumvent this problem by using E-beam lithography to write different grating pitches on a single wafer. The technique, however, involves high capital cost, low throughput and high cost of maintenance. Accordingly there is a need for a new method of making multiple wavelength lasers on a single wafer.

SUMMARY OF THE INVENTION

In accordance with the invention, a plurality of different wavelength semiconductor lasers are fabricated on a single semiconductor substrate by establishing a thermal gradient across the substrate during epitaxial growth. The result is a variation in composition which produces a corresponding variation of laser wavelength across the substrate. The a thermal gradient is preferably achieved by disposing a patterned layer of material (heat reflecting or heat absorbing) on the back side of the substrate, radiatively heating the backside and growing the active layers on the front side. The backside layer is removed when the substrate is lapped to final thickness.

BRIEF DESCRIPTION OF THE DRAWINGS

The nature, advantages and various additional features of the invention will appear more fully upon consideration of the illustrative embodiments now to be described in the accompanying drawings. In the drawings.

It is to be understood that these drawings are for purposes of illustrating the concepts of the invention and are not to scale.

DETAILED DESCRIPTION

Figure 1:
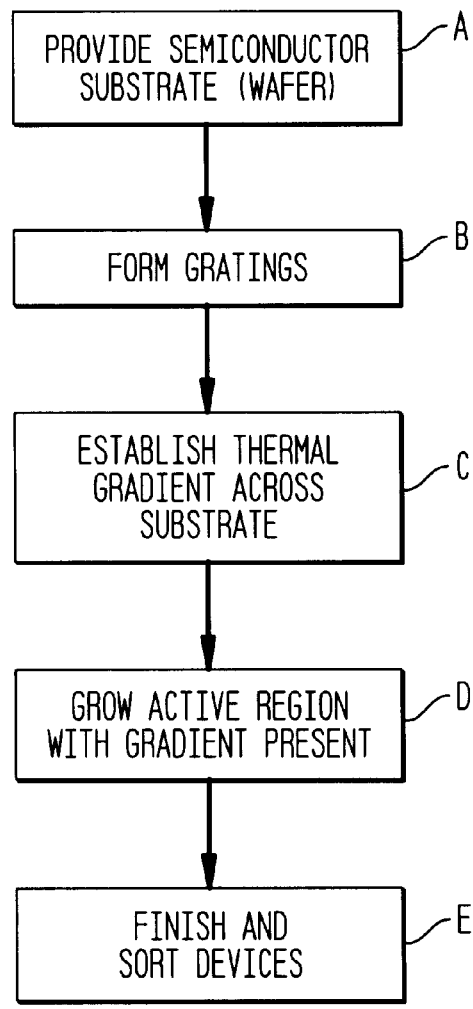
FIG. 1 is a schematic block diagram of the steps involved in making semiconductor lasers in accordance with the invention.

Referring to the drawings, FIG. 1 illustrates the steps of the general process for making a plurality of different wavelength semiconductor lasers. As shown in block A of FIG. 1, the first step is to provide a semiconductor substrate. Typically, the substrate is a 2 inch diameter wafer of a direct bandgap semiconductor such as indium phosphide (InP). InP is advantageous because it can be used to grow lasers that emit radiation in the 1.3–1.55 micrometer wavelength region commonly used in optical fiber systems.

The next step, shown in block B, is to form device gratings across the substrate. This typically involves forming a regular sequence of elevated and depressed regions in the surface of the semiconductor layer. The gratings can be formed in the InP or an optional InGaAsP overlayer can be deposited on the InP substrate and the gratings can be formed in the InGaAsP. The gratings are typically produced by holographic photolithography, followed either by wet chemical etching or reactive ion etching (RIE). The recessed features typically have a depth in the range 20–200 nanometers prior to any heat treatment.

The third step (Block C) is to establish a thermal gradient across the substrate prior to or during the growth of active layers. The preferred method of establishing the gradient is to form a patterned layer of material on the backside of the substrate (the side opposite the growth surface) and to heat the wafer to growth temperature by radiant heat directed to the back side. The material of the patterned layer is chosen to reflect or absorb the radiant heat, and the pattern is chosen to effect a desired thermal gradient across the substrate.

Figure 2:
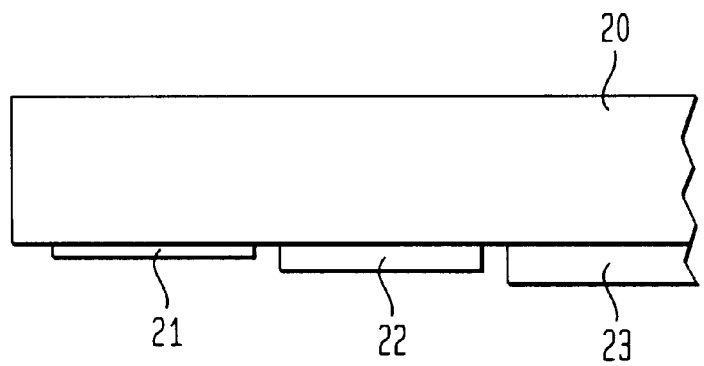
FIG. 2 illustrates a preferred pattern of material for producing a thermal gradient.

FIG. 2 illustrates a preferred pattern of material comprising a substrate 20 with a plurality of regions 21, 22, 23 of respectively different thickness deposited on the substrate backside. Thicknesses will typically vary in increments of at least 1000 angstroms. Suitable materials include metal oxides such as zirconium oxide and exemplary thicknesses are 3000, 5000 and 7000 angstroms. The pattern can vary in thickness along a single direction, can vary radially or can vary circumferentially.

The next step, shown in Block D of FIG. 1, is to grow a plurality of semiconductor layers on the patterned surface of the substrate while a thermal gradient is maintained. These layers typically include barrier layers and quantum well layers to define a plurality of quantum wells having energy gaps corresponding to the approximate wavelength of lasing. The preferred method of growth is Liquid Phase Epitaxy (LPE), although Metal-Organic Vapor Phase Epitaxy (MOVPE) or Hydride Vapor Phase Epitaxy (HVPE) can also be used.

Figure 3:
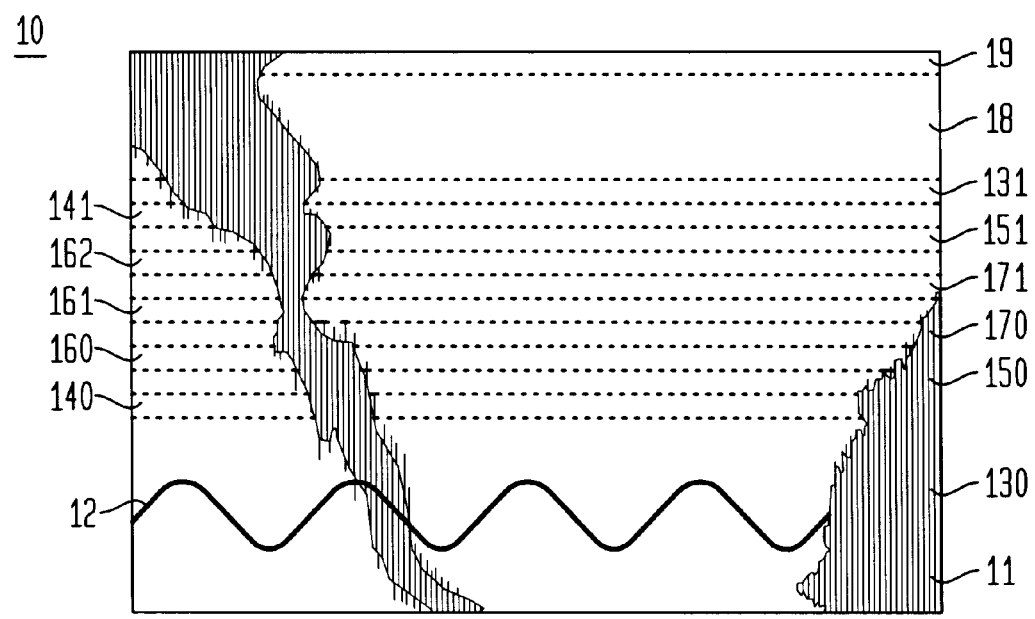
FIG. 3 schematically illustrates a typical laser preform made in accordance with the process of FIG. 1.

FIG. 3 schematically depicts a layered structure 10 suitable for making a DFB laser. Substrate 11 exemplarily is a (100) n-type single crystal InP body, typically a InP wafer. On a major surface of the wafer is formed a regularly spaced sequence of elongate recessed features, which result in grating 12. Exemplarily the features are parallel to the (011) direction and have a repeat distance of about 240 nm. Except for establishment of the thermal gradient in FIG. 1, Block C, structure 10 can be grown in a conventional fashion such as described in U.S. Pat. No. 3,346,855, which is incorporated herein by reference. Layer 130 is InGaAsP of composition having an energy gap corresponding to a wavelength ($\lambda_g$) of 1.08 $\mu$m, layers 140 and 150 have $\lambda_g$ of 1.16 and 1.25 $\mu$m, respectively, quantum wells 160, 161 and 162 are InGaAsP of $\lambda_g$=1.67 $\mu$m, and barrier layers 170 and 171 are InGaAsP of $\lambda_g$ 1.25 $\mu$m. Layers 151, 141 and 131 are of essentially the same composition as layers 150, 140 and 130, respectively. Layer 18 is p-InP, and layer 19 is p+InGaAsP. Conventionally composition in InP-based semiconductor material is specified in terms of $\lambda_g$, as is done herein. Furthermore, expressions such as "InGaAsP" are well understood to merely list the chemical constituents and not to imply the presence of equimolar amounts of the constituents. Exemplary, layer 130 is about 130 nm thick, layers 140, 150, 151 and 141 each are about 25 nm thick, barrier layers 170 and 171 each are about 22.5 nm thick, and the quantum well layers 160, 161 and 162 have a thickness in the ranges 5–9 nm.

It will be appreciated that the structure of FIG. 3 is exemplary only, and that the invention is not limited to this particular structure. For instance, lasers according to the invention need not be quantum well lasers, could have fewer or more than three quantum wells, and/or could have a grating above the active region of the laser.

The final step (Block E) is to finish and sort the lasers. From the structure shown in FIG. 3, lasers can be made by conventional methods that typically include lapping (thereby removing any material added to the backside), deposition of contacts and possible deposition of reflecting or anti-reflection coatings, and cleaving into a plurality of devices. The devices are then sorted in accordance with lasing wavelength.

The invention can now be better understood by consideration of the following specific examples.

EXAMPLE

Several Multi-Quantum Well (MQW) laser structures were grown in an EMCORE D-125 multi-wafer low-pressure MOCVD reactor using TMI, TEG, AsH$_3$, PH$_3$, SiH$_4$ and DMZ. The reactor is capable of growing epitaxial layers on three two-inch wafers simultaneously. The wafers were mounted horizontally in shallow pockets on a rotating platter. The platter was heated radiatively from below and the temperature of the platter was monitored with a thermocouple positioned close to the underside of the rotating platter. The MQW laser structures consisted of 1000 Å of n-InP, 500 Å of GaInAsp (1.17 $\mu$m composition, -0.4%), seven GaInAsP quantum wells (70 Å, 1.62 $\mu$m composition, 0.8%), separated by six GaInAsp barriers (60 Å, 1.17 $\mu$m composition, 0.4%), 1000 Å of GaInAsP (1.17 $\mu$m composition, -0.4%), 5500 Å of p-InP, 600 Å of p-GaInAsP (1.17 $\mu$m composition, -0.4%) grown sequentially on an n-type Indium Phosphide substrate.

A MQW laser structure was grown on two similar substrates in the same growth run. The substrates were two inch diameter and were adjacent wafers from the same Indium Phosphide boule. The wavelength was measured by photoluminescence and the average wavelength over the wafer determined with a 6 mm exclusion zone to the edge of the wafer. The photoluminescence wavelength is an indication/measurement of the semiconductor laser operating wavelength. Substrate A had a coating on the backside of the wafer while Substrate B had no coating on the backside.

The following data show the effect of backside coating on an MQW laser structure.

| Substrate | Average Wavelength | Sigma | Photoluminescence Intensity |
|---|---|---|---|
| Wafer A, with coating | 1473 nm | 3.59 nm | 36030 |
| Wafer B, no coating | 1498 nm | 2.26 nm | 45730 |

The backside coated wafer had an average wavelength 25 nm lower than the uncoated wafer. There was a slight increase in the wavelength uniformity and decrease in the photoluminescence intensity of a backside coated substrate. This is not thought to be significant because firstly the growth was optimised for substrates without backside coatings and secondly the changes were well within the run-to-run variation observed on MQW growths. However, the change in photoluminescence wavelength of 25 nm is significant because previous experience with the MOCVD reactor over many growths has shown that for similar substrates the average photoluminescence wavelength variation from wafer to wafer in the same growth run is less than 6 nm. Note that the growth rate, estimated from the MQW period, was unchanged with the presence of the backside coating. The MQW period (well plus barrier) was determined by x-ray measurement.

In the second experiment, the backside of two similar wafers were partially coated. Wafer A had 3000 Å coating and wafer C had 5000 Å coating. Wafer B was a control wafer with no coating. An MQW structure was grown on all three wafers simultaneously.

The effect of backside coating on MQW growth is shown by the following data:

| Substrate | Average Wavelength in uncoated region | Average wavelength in coated region |
|---|---|---|
| Wafer A/3000Å | 1478 nm | 1453 nm |
| Wafer B/no coating | 1484 nm | — |
| Wafer C/5000Å | 1473 nm | 1451 nm |

The observed difference in wavelength between the coated and non-coated regions of the wafer was 25 nm for wafer A and 22 nm for wafer C. The spatial change in wavelength from the coated to the non-coated region was probed by the use of a small excitation spot photoluminescence technique, a gradient of 3 to 3.5 nm per mm was measured on wafer A and wafer B.

In a first subsidiary experiment we grew an identical MQW at a substrate temperature 10° C. higher and observed an average photoluminescence wavelength decrease of 23 nm, and an identical MQW at a substrate temperature 10° C. lower we observed the average photoluminescence wavelength increase of 29 nm. Hence, the application of a coating to the back of a substrate has the same effect of increasing the substrate temperature, in addition with the particular type and thickness of coating used (3000 to 5000 Å ) the temperature difference between the coated and uncoated substrates is approximately 10° C.

In a second subsidiary experiment a single quaternary layer (GaInAsP) was grown on two similar Indium phosphide substrates, one with a coating and one without a coating. The following results were obtained.

| Substrate | Lattice Mismatch | Wavelength |
|---|---|---|
| With coating | −0.4889% | 1167 nm |
| Without coating | −0.3576% | 1186 nm |

The lattice mismatch with the Indium Phosphide substrate was measured on an x-ray crystallography apparatus. From the photoluminescence wavelength and the lattice mismatch the composition of the GaInAsP for the layers was calculated and is shown here:

| Substrate | Ga | In | As | P |
|---|---|---|---|---|
| With coating | 0.231 | 0.769 | 0.430 | 0.570 |
| Without coating | 0.234 | 0.766 | 0.455 | 0.545 |

From this table it is evident that the GaInAsP layer grown on the substrate with a backside coating contains less Gallium and more Phosphorus than that grown on the substrate without a coating. The calculated change in Gallium composition is small at 0.003 whereas the change in Arsenic is much larger at 0.025. Therefore the effect of the backside coating is to decrease the Gallium considerably less than Arsenic. In the epitaxial growth of GaInAsP the decomposition of Phosphine is thought to be much more slower than that of Arsine, TEG and TMI. The decomposition of Phosphine is much more temperature dependent. Therefore the backside coating locally increases the temperature of that part of the substrate thus increasing the decomposition of Phosphine and hence increases the amount of Phosphorus incorporated in the epitaxial layer. The enhanced Phosphorus incorporation lowers the photoluminescence wavelength and adds extra tensile strain to the layer.

Thus it is believed that a substrate with a backside coating absorbs more thermal radiation from the reactor platter (wafer holder) than an uncoated substrate. Hence, any region of a substrate with a backside coating is at a higher temperature than regions of a substrate without a backside coating.

It is to be understood that the above-described embodiments are illustrative of only a few of the many possible specific embodiments which can represent applications of the principles of the invention. Numerous and varied other arrangements can be made by those skilled in the art without departing from the spirit and scope of the invention.

What is claimed:

1. A method for making a plurality of different wavelength semiconductor lasers on a single substrate comprising the steps of:

providing a semiconductor substrate;

forming on said substrate gratings for a plurality of semiconductor lasers;

establishing a thermal gradient across the substrate;

growing active layers for said lasers on said substrate while maintaining said thermal gradient;

finishing separating and sorting a plurality of lasers from said substrate.

2. The method of claim 1 wherein said substrate has a topside where said active layers are grown and an opposing backside and wherein said thermal gradient is established by depositing a pattern of material on said backside and radiatively heating said substrate backside during growth of said active layers.

3. The method of claim 2 wherein said deposited pattern of material comprises metal oxide.

4. The method of claim 2 wherein said pattern of material comprises at least two different thicknesses of material differing by at least 1000 angstroms in thickness.

5. The method of claim 2 wherein said pattern of material varies in thickness along at least one direction across said substrate.

6. The method of claim 2 wherein said substrate is a circular wafer and said pattern of material varies in thickness along each radial direction across said wafer.

7. The method of claim 2 wherein said substrate is a circular wafer and said pattern of material varies in thickness along a circumferential direction around said wafer.

* * * * *